(12) United States Patent
Hiratani et al.

(10) Patent No.: US 11,777,274 B2
(45) Date of Patent: Oct. 3, 2023

(54) SEMICONDUCTOR OPTICAL DEVICE AND METHOD FOR MANUFACTURING THE SAME

(71) Applicant: SUMITOMO ELECTRIC INDUSTRIES, LTD., Osaka (JP)

(72) Inventors: Takuo Hiratani, Osaka (JP); Hideki Yagi, Osaka (JP); Naoki Fujiwara, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 141 days.

(21) Appl. No.: 17/493,393

(22) Filed: Oct. 4, 2021

(65) Prior Publication Data

US 2022/0158412 A1    May 19, 2022

(30) Foreign Application Priority Data

Nov. 19, 2020  (JP) ................. 2020-192117

(51) Int. Cl.
| | |
|---|---|
| *H01S 5/00* | (2006.01) |
| *H01S 5/10* | (2021.01) |
| *H01S 5/125* | (2006.01) |
| *H01S 5/12* | (2021.01) |
| *H01S 5/02* | (2006.01) |

(52) U.S. Cl.
CPC ............ *H01S 5/1003* (2013.01); *H01S 5/021* (2013.01); *H01S 5/101* (2013.01); *H01S 5/1032* (2013.01); *H01S 5/125* (2013.01); *H01S 5/1209* (2013.01); *H01S 5/1014* (2013.01); *H01S 5/1228* (2013.01)

(58) Field of Classification Search
CPC ........ H01S 5/1003; H01S 5/021; H01S 5/101; H01S 5/1032; H01S 5/1209; H01S 5/125; H01S 5/1014; H01S 5/1228
See application file for complete search history.

(56) References Cited

U.S. PATENT DOCUMENTS

| | | | |
|---|---|---|---|
| 2004/0037342 A1* | 2/2004 | Blauvelt | H01S 5/12 372/102 |
| 2005/0163171 A1* | 7/2005 | Ng | H01S 5/02325 372/67 |

(Continued)

OTHER PUBLICATIONS

Corbett, B., et al., "Transfer-printing for heterogeneous integration" OFC 2019 M2D.1, 2019, 3 pgs.

*Primary Examiner* — Kinam Park
(74) *Attorney, Agent, or Firm* — Volpe Koenig

(57) ABSTRACT

A semiconductor optical device includes a substrate including a waveguide made of silicon and a semiconductor layer joined to the substrate so as to overlap the waveguide and including a diffraction grating formed of a first semiconductor layer and a second semiconductor layer having different refractive indices. The waveguide includes a bent portion and a plurality of straight portions that are connected to each other by the bent portion and that extend straight. The first semiconductor layer and the second semiconductor layer are each made of a compound semiconductor. The second semiconductor layer is embedded in the first semiconductor layer and includes a plurality of portions arranged in a direction in which the plurality of straight portions extend. The diffraction grating is positioned above the plurality of straight portions.

11 Claims, 11 Drawing Sheets

(56) References Cited

U.S. PATENT DOCUMENTS

| | | | |
|---|---|---|---|
| 2008/0240646 A1* | 10/2008 | Yamazaki | G02B 6/12007 385/14 |
| 2013/0094527 A1* | 4/2013 | Fukuda | H01S 5/02325 372/20 |
| 2015/0270684 A1* | 9/2015 | Suzuki | H01S 5/1032 372/45.01 |
| 2018/0026426 A1* | 1/2018 | Kawakita | G02B 5/284 372/20 |
| 2018/0287343 A1* | 10/2018 | Morrison | H01S 5/1209 |
| 2020/0018701 A1* | 1/2020 | Meyer | H01S 5/3422 |
| 2020/0069225 A1* | 3/2020 | Vizbaras | A61B 5/1455 |
| 2020/0176949 A1* | 6/2020 | Gotoda | H01S 5/02255 |

* cited by examiner

SEMICONDUCTOR OPTICAL DEVICE AND METHOD FOR MANUFACTURING THE SAME

CROSS REFERENCES TO RELATED APPLICATIONS

This application claims priority from Japanese Patent Application No. 2020-192117, filed on Nov. 19, 2020, the entire subject matter of which is incorporated herein by reference.

BACKGROUND OF THE INVENTION

1. Field of the Invention

The present disclosure relates to a semiconductor optical device and a method for manufacturing the semiconductor optical device.

2. Description of the Related Art

A semiconductor optical device obtained by joining a light emitting element formed of a compound semiconductor to a silicon-on-insulator (SOI) substrate having a waveguide formed thereon (silicon photonics) is known (refer to, for example, B. Corbett et al., "Transfer-printing for heterogeneous integration" OFC 2019 M2D.1, 2019).

A wavelength of light can be controlled by using a diffraction grating. For example, a projecting-and-recessed pattern that functions as a diffraction grating is formed on a silicon (Si) layer of an SOI substrate. The characteristics of the diffraction grating are determined by the depth of the projecting-and-recessed pattern. Since Si has a refractive index that greatly differs from that of air, the characteristics of the diffraction grating greatly vary due to variations of the depth of the projecting-and-recessed pattern.

A compound semiconductor having a diffraction grating formed therein may be joined to an SOI substrate. Since the difference in refractive index between a compound semiconductor and air is less than that between Si and air, controllability of the characteristics of the diffraction grating can be improved. When the length of the diffraction grating is increased, for example, to increase the reflectance, the length of the device is also increased. A device that is long in one direction has low mechanical strength, and is therefore easily distorted in, for example, a joining process.

SUMMARY OF THE INVENTION

Accordingly, it is desirable to provide a semiconductor optical device including a diffraction grating with stable characteristics and having high mechanical strength.

A semiconductor optical device according to the present disclosure includes a substrate including a waveguide made of silicon and a semiconductor layer joined to the substrate so as to overlap the waveguide and including a diffraction grating formed of a first semiconductor layer and a second semiconductor layer having different refractive indices. The waveguide includes a bent portion and a plurality of straight portions that are connected to each other by the bent portion and that extend straight. The first semiconductor layer and the second semiconductor layer are each made of a compound semiconductor. The second semiconductor layer is embedded in the first semiconductor layer and includes a plurality of portions arranged in a direction in which the plurality of straight portions extend. The diffraction grating is positioned above the plurality of straight portions.

A method for manufacturing a semiconductor optical device according to the present disclosure includes a step of joining a semiconductor layer to a substrate including a waveguide made of silicon, the semiconductor layer including a diffraction grating formed of a first semiconductor layer and a second semiconductor layer having different refractive indices. The waveguide includes a bent portion and a plurality of straight portions that are connected to each other by the bent portion and that extend straight. The first semiconductor layer and the second semiconductor layer are each made of a compound semiconductor. The second semiconductor layer is embedded in the first semiconductor layer and includes a plurality of portions arranged in a direction in which the plurality of straight portions extend. In the step of joining the semiconductor layer to the substrate, the semiconductor layer is joined so that the diffraction grating extends in the direction in which the plurality of straight portions extend and is positioned above the plurality of straight portions.

DESCRIPTION OF THE PREFERRED EMBODIMENTS

Description of Embodiments of Present Disclosure

Figure 1A:
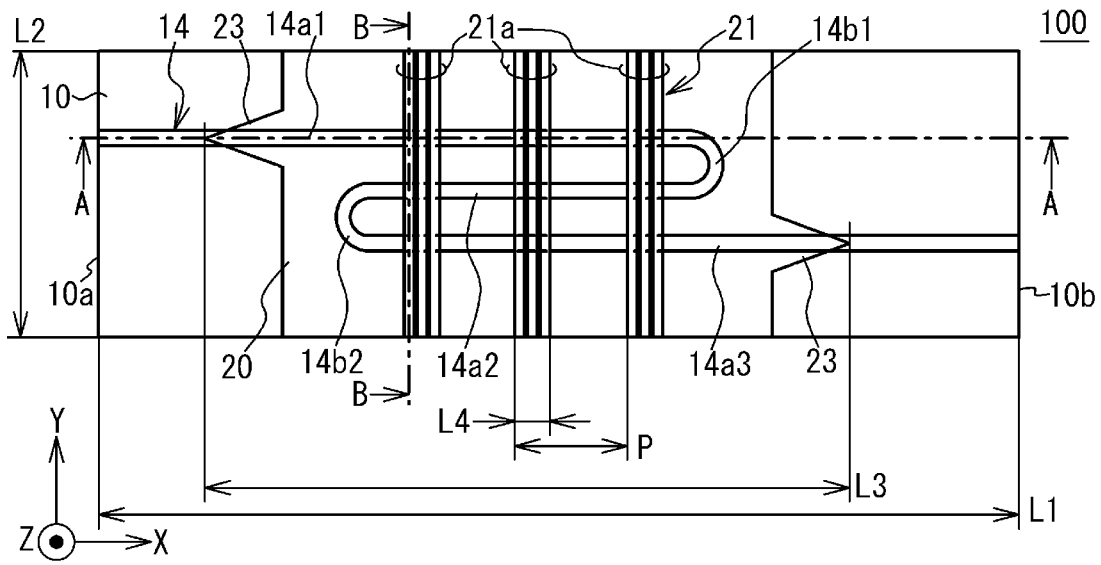
FIG. 1A is a plan view illustrating a semiconductor optical device according to an embodiment.

Embodiments of the present disclosure will now be described.

According to one embodiment of the present disclosure, (1) a semiconductor optical device includes a substrate including a waveguide made of silicon and a semiconductor layer joined to the substrate so as to overlap the waveguide and including a diffraction grating formed of a first semiconductor layer and a second semiconductor layer having different refractive indices. The waveguide includes a bent portion and a plurality of straight portions that are connected to each other by the bent portion and that extend straight. The first semiconductor layer and the second semiconductor layer are each made of a compound semiconductor. The second semiconductor layer is embedded in the first semiconductor layer and includes a plurality of portions arranged in a direction in which the plurality of straight portions extend. The diffraction grating is positioned above the plurality of straight portions. Since the waveguide includes the bent portion, it is not necessary that the waveguide have a long length in one direction. Similarly to the waveguide, it is also not necessary that the semiconductor layer have a long length on one direction. Therefore, the mechanical strength of the semiconductor layer is increased. Variations in the characteristics of the diffraction grating due to variations in the thickness of the second semiconductor layer are reduced, and stable characteristics can be obtained.

(2) The plurality of portions of the second semiconductor layer may extend across the plurality of straight portions. When the diffraction grating is disposed above each of the straight portions, excellent characteristics can be obtained.

(3) The diffraction grating may include a plurality of partial diffraction gratings, and the plurality of partial diffraction gratings may be arranged along the plurality of straight portions. When the partial diffraction gratings are disposed above each of the straight portions, excellent characteristics can be obtained.

(4) The diffraction grating may include a plurality of partial diffraction gratings, and the plurality of partial diffraction gratings may be arranged periodically along the plurality of straight portions and form a sampled grating-distributed Bragg reflector (SG-DBR). When the partial diffraction gratings are disposed above each of the straight portions, excellent characteristics can be obtained.

(5) The first semiconductor layer may contain indium phosphide, and the second semiconductor layer may contain gallium indium arsenide phosphide. Variations in the characteristics of the diffraction grating are reduced, and stable characteristics can be obtained.

(6) The plurality of straight portions may extend in a same direction. It is not necessary that the waveguide have a long length in the direction of the straight portions. Similarly to the waveguide, it is also not necessary that the semiconductor layer have a long length on one direction. Therefore, the mechanical strength of the semiconductor layer is increased.

(7) The plurality of straight portions of the waveguide may include three or more straight portions, and the diffraction grating may be positioned above the three or more straight portions. It is not necessary that the waveguide have a long length in the direction of the straight portions. Similarly to the waveguide, it is also not necessary that the semiconductor layer have a long length on one direction. Therefore, the mechanical strength of the semiconductor layer is increased.

(8) The semiconductor layer may include a tapered portion at an end portion thereof and above at least one of the plurality of straight portions, the tapered portion being tapered along the at least one of the plurality of straight portions. The coupling efficiency between the semiconductor layer and the waveguide can be increased, and light loss can be reduced.

(9) The semiconductor optical device may further include heater that is provided on the semiconductor layer and that extends along the waveguide. Since the heater extends along the waveguide that is bent, heat is effectively conducted from the heater to the waveguide. The amount of electric power consumption can be reduced, and a temperature change and wavelength control can be efficiently achieved.

(10) The semiconductor optical device may further include a gain region having an optical gain, the gain region being joined to the substrate and formed of a compound semiconductor, and the semiconductor layer may reflect light emitted from the gain region. Since the diffraction grating has a high reflectance, light loss can be reduced, and the light can be reflected toward the gain region.

(11) A method for manufacturing a semiconductor optical device includes a step of joining a semiconductor layer to a substrate including a waveguide made of silicon, the semiconductor layer including a diffraction grating formed of a first semiconductor layer and a second semiconductor layer having different refractive indices. The waveguide includes a bent portion and a plurality of straight portions that are connected to each other by the bent portion and that extend straight. The first semiconductor layer and the second semiconductor layer are each made of a compound semiconductor. The second semiconductor layer is embedded in the first semiconductor layer and includes a plurality of portions arranged in a direction in which the plurality of straight portions extend. In the step of joining the semiconductor layer to the substrate, the semiconductor layer is joined so that the diffraction grating extends in the direction in which the plurality of straight portions extend and is positioned above the plurality of straight portions. Since the waveguide includes the bent portion, it is not necessary that the waveguide have a long length in one direction. Similarly to the waveguide, it is also not necessary that the semiconductor layer have a long length on one direction. Therefore, the mechanical strength of the semiconductor layer is increased. Variations in the characteristics of the diffraction grating due to variations in the thickness of the second semiconductor layer are reduced, and stable characteristics can be obtained.

Detailed Description of Embodiments of Present Disclosure

Examples of semiconductor optical devices and methods for manufacturing the semiconductor optical devices according to embodiments of the present disclosure will now be described with reference to the drawings. The present disclosure is not limited to these examples, but is defined by the scope of the claims and intended to include equivalents to the scope of the claims and all modifications within the scope.

First Embodiment

Semiconductor Optical Device

Figure 1B:
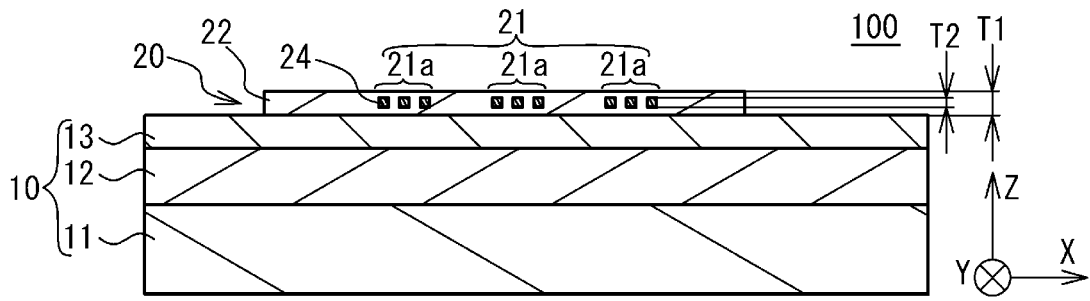
FIG. 1B is a sectional view of FIG. 1A taken along line A-A.
Figure 1C:
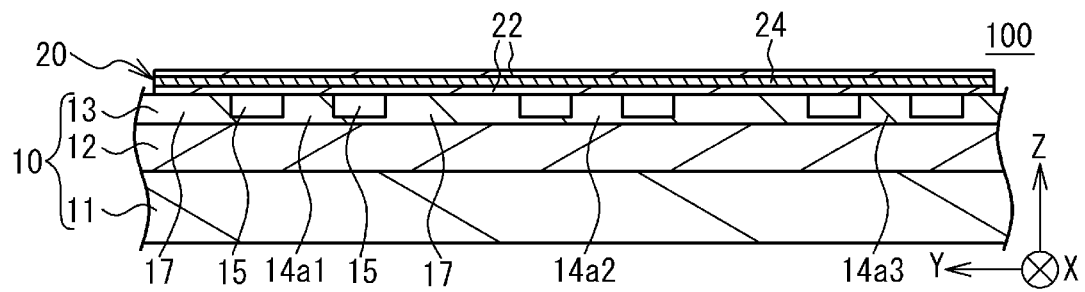
FIG. 1C is a sectional view of FIG. 1A taken along line B-B.

FIG. 1A is a plan view illustrating a semiconductor optical device 100 according to an embodiment. FIG. 1B is a sectional view of FIG. 1A taken along line A-A. FIG. 1C is a sectional view of FIG. 1A taken along line B-B. As illustrated in FIGS. 1A to 1C, the semiconductor optical device 100 includes a substrate 10 and a semiconductor layer 20. FIG. 1A illustrates the semiconductor layer 20 in a see-through manner.

As illustrated in FIGS. 1B and 1C, the substrate 10 is an SOI substrate including a silicon substrate 11, a silicon oxide ($SiO_2$) layer 12, and a silicon (Si) layer 13 that are stacked in that order. The $SiO_2$ layer 12 has a thickness of, for example, 2 μm. The Si layer 13 has a thickness of, for example, 220 nm. The Si layer 13 of the substrate 10 has a waveguide 14 and grooves 15 as described below. The semiconductor layer 20 is joined to an upper surface of the Si layer 13 of the substrate 10. An insulating film that covers the substrate 10 and the semiconductor layer 20 may be provided. Two sides of the substrate 10 extend in an X-axis direction, and the other two sides of the substrate 10 extend in a Y-axis direction. The substrate 11, the $SiO_2$ layer 12, and the Si layer 13 are stacked in a Z-axis direction. The X-axis direction, the Y-axis direction, and the Z-axis direction are orthogonal to each other.

For example, the substrate 10 illustrated in FIG. 1A has a length L1 of 0.6 mm in the X-axis direction and a length L2 of 0.4 mm in the Y-axis direction. The semiconductor layer 20 has a length L3 of 0.4 mm in the X-axis direction, and the length thereof in the Y-axis direction is, for example, the same as that of the substrate 10. End surfaces of the substrate 10 are coated to prevent reflection of light. One end portion of the substrate 10 in the X-axis direction is defined as an end portion 10a, and the other end portion is defined as an end portion 10b.

As illustrated in FIG. 1A, the waveguide 14 includes three straight portions 14a1 to 14a3 and two bent portions 14b1 and 14b2. The straight portions 14a1 to 14a3 extend in the X-axis direction. The three straight portions 14a1 to 14a3 are successively arranged in the Y-axis direction and are separated from each other.

The bent portions 14b1 and 14b2 are, for example, arc-shaped. The bent portion 14b1 is bent 180° from a direction toward the end portion 10b of the substrate 10 to a direction away from the end portion 10b of the substrate 10. The bent portion 14b2 is bent 180° from a direction toward the end portion 10a of the substrate 10 to a direction away from the end portion 10a of the substrate 10. Among the bent portions 14b1 and 14b2, the bent portion 14b1 is closer to the end portion 10b and the bent portion 14b2 is closer to the end portion 10a.

One end of the straight portion 14a1 is positioned on the end portion 10a of the substrate 10, and the other end is connected to one end of the bent portion 14b1. One end of the straight portion 14a2 is connected to the other end of the bent portion 14b1, and the other end of the straight portion 14a2 is connected to one end of the bent portion 14b2. One end of the straight portion 14a3 is connected to the other end of the bent portion 14b2, and the other end of the straight portion 14a3 is positioned on the end portion 10b of the substrate 10.

As illustrated in FIG. 1C, the grooves 15 are provided on both sides of each of the straight portions 14a1 to 14a3 in the Y-axis direction. The grooves 15 are also provided on both sides of each of the bent portions 14b1 and 14b2. The grooves 15 may each be filled with air, for example, or have an insulator made of $SiO_2$ or the like embedded therein. The grooves 15 are surrounded by a flat surface (terrace 17) of the Si layer 13. An upper surface of the waveguide 14 and an upper surface of the terrace 17 are at the same height in the Z-axis direction.

The semiconductor layer 20 is made of, for example, a III-V compound semiconductor, and is joined to an upper surface of the substrate 10. As illustrated in FIG. 1A, the semiconductor layer 20 covers the three straight portions 14a1 to 14a3 and the two bent portions 14b1 and 14b2 of the waveguide 14 and is optically coupled to the waveguide 14. The semiconductor layer 20 includes tapered portions 23 at end portions thereof and above the straight portions 14a1 and 14a3, the tapered portions 23 being tapered in a direction in which the straight portions extend. One tapered portion 23 is positioned above the straight portion 14a1 of the waveguide 14 and tapered in a direction from the semiconductor layer 20 toward the end portion 10a of the substrate 10. The other tapered portion 23 is positioned above the straight portion 14a3 and tapered in a direction from the semiconductor layer 20 toward the end portion 10b of the substrate 10. Due to the tapered portions 23, reflection of light at the end portions of the semiconductor layer 20 is reduced and the coupling efficiency between the semiconductor layer 20 and the waveguide 14 is increased. The straight portions 14a1 and 14a3 of the waveguide 14 may also include tapered portions having shapes corresponding to the shapes of the tapered portions 23.

As illustrated in FIGS. 1B and 1C, the semiconductor layer 20 includes an indium phosphide (InP) layer 22 and a gallium indium arsenide phosphide (GaInAsP) layer 24. As illustrated in FIG. 1B, the GaInAsP layer 24 includes a plurality of portions that are periodically arranged in the X-axis direction and embedded in the InP layer 22. The portions of the GaInAsP layer 24 cross the straight portions 14a1 to 14a3 of the waveguide 14 in the Y-axis direction.

The GaInAsP layer 24 has a refractive index that differs from that of the InP layer 22. A region in which portions of the InP layer 22 and the portions of the GaInAsP layer 24 are alternately arranged functions as a diffraction grating 21. As illustrated in FIGS. 1A and 1B, the diffraction grating 21 includes a plurality of partial diffraction gratings 21a and functions as a sampled grating-distributed Bragg reflector (SG-DBR) region. The partial diffraction gratings 21a are separated from each other and arranged in the X-axis direction. In FIG. 1A, a period P between adjacent ones of the partial diffraction gratings 21a is, for example, 100 μm. Each partial diffraction grating has a length L4 of, for example, 10 μm in the X-axis direction. The partial diffraction gratings 21a extend across and extend above the three straight portions 14a1 to 14a3, and are orthogonal to the straight portions.

Light is introduced into the waveguide 14 from one of the end portions 10a and 10b in FIG. 1A. The light propagates through the waveguide 14 and is reflected by the diffraction grating 21. In the example illustrated in FIG. 1A, three partial diffraction gratings 21a are disposed to extend above each of the three straight portions 14a1 to 14a3. Accordingly, characteristics similar to those of a structure in which nine partial diffraction gratings are disposed on the waveguide 14 can be obtained. Although the number of partial diffraction gratings 21a is three in FIG. 1A, the number may instead be two or more than three.

In FIGS. 1B and 1C, the upper surface of the substrate 10 and an upper surface of the semiconductor layer 20 are exposed to air. To protect the substrate 10 and the semiconductor layer 20, the substrate 10 and the semiconductor layer 20 may be covered with an insulating film (not illustrated in FIGS. 1B and 1C). The insulating film may be, for example, an inorganic insulating film made of silicon dioxide ($SiO_2$). The insulating film may have a thickness of, for example, 1 µm. To control the amount of light bleeding from the semiconductor layer 20, the insulating film preferably has a thickness of, for example, greater than or equal to 0.8 µm. To reduce variations in the characteristics of the diffraction grating 21 due to stress, the insulating film preferably has a thickness of less than or equal to 2 µm.

Figure 2:
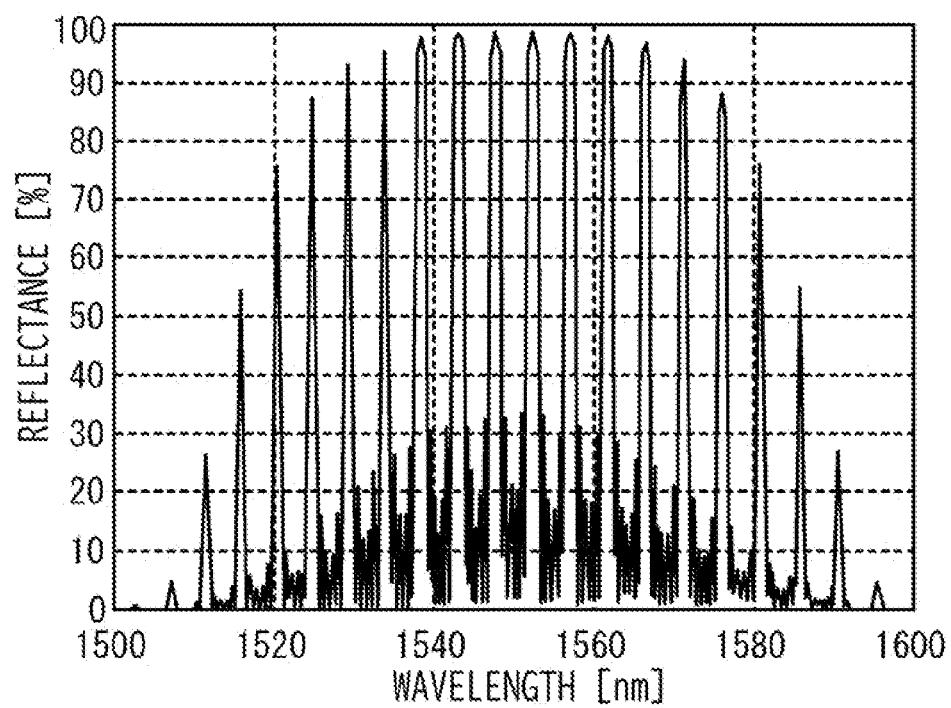
FIG. 2 is a graph showing reflection characteristics of a diffraction grating.

FIG. 2 is a graph showing the reflection characteristics of the diffraction grating 21. The horizontal axis represents the wavelength of light, and the vertical axis represents the reflectance. The reflection characteristics were calculated assuming that a length L of each partial diffraction grating 21a is 10 µm, the period P is 100 µm, the number of partial diffraction gratings 21a is two, a thickness T1 of the semiconductor layer 20 is 0.2 µm, and a thickness T2 of the GaInAsP layer 24 of the semiconductor layer 20 is 90 nm. When the two partial diffraction gratings 21a are provided above each of the three straight portions 14a1 to 14a3, characteristics similar to those obtained when six partial diffraction gratings are arranged can be obtained. As illustrated in FIG. 2, the reflectance has peaks at a plurality of wavelengths in the range of 1500 nm to 1600 nm. When an insulating film is provided on the semiconductor layer 20, the thickness of the GaInAsP layer 24 is preferably increased in consideration of the difference in refractive index between the insulating film and air. Also when an insulating film is provided, reflectance characteristics similar to those shown in FIG. 2 can be obtained.

Manufacturing Method

To manufacture the semiconductor optical device 100, a wafer of an SOI substrate for manufacturing the substrate 10 and a compound semiconductor wafer for manufacturing the semiconductor layer 20 are prepared.

The SOI substrate in the form of a wafer has a plurality of regions in each of which the semiconductor optical device 100 is to be formed. The waveguide 14 is formed in each of the regions by etching the SOI substrate. More specifically, resist is patterned so that areas where the waveguide 14 and the terrace 17 are to be formed are covered with the resist and that areas where the grooves 15 are to be formed are exposed and not covered with the resist. The Si layer 13 is, for example, dry etched in the areas that are exposed and not covered with the resist, so that the grooves 15 are formed. The waveguide 14 and the terrace 17 are formed in areas that are protected by the resist.

FIGS. 3A, 4A, 5A, 6A, and 7A are plan views illustrating a method for manufacturing the semiconductor layer 20. FIGS. 3B, 4B, 5B, 6B, and 7B are sectional views of the corresponding plan views taken along line C-C. FIG. 7C is a sectional view illustrating a step of joining the semiconductor layer 20 to the substrate 10.

Figure 3A:
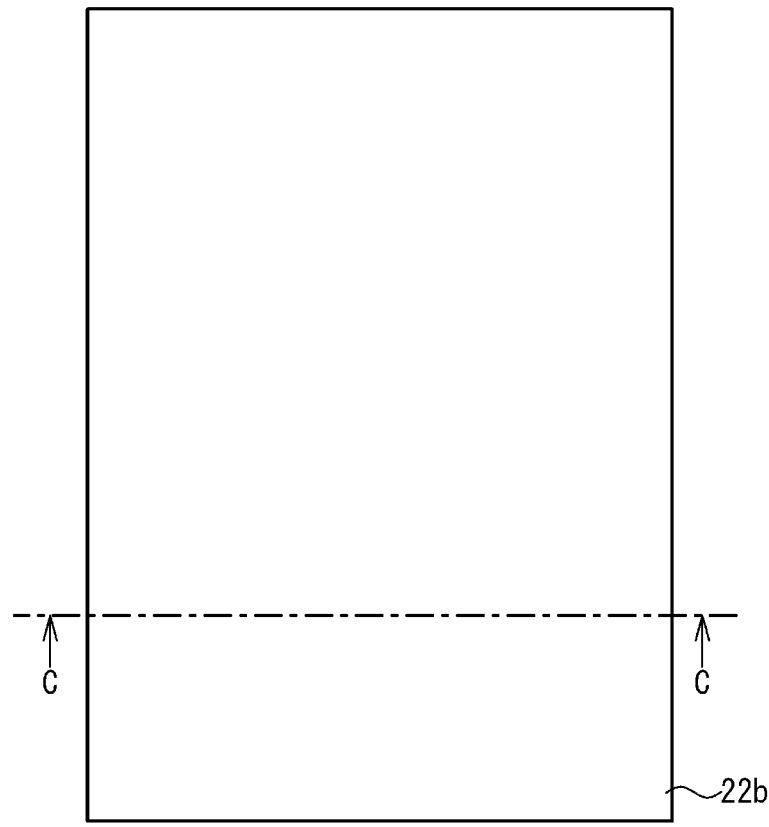
FIG. 3A is a plan view illustrating a method for manufacturing a semiconductor layer.
Figure 3B:
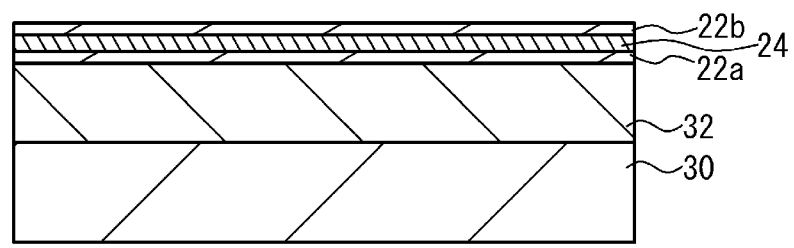
FIG. 3B is a sectional view of FIG. 3A taken along line C-C.

As illustrated in FIGS. 3A and 3B, a sacrificial layer 32, an InP layer 22a, a GaInAsP layer 24, and an InP layer 22b are epitaxially grown in that order on an upper surface of a wafer-shaped substrate 30 by, for example, organometallic vapor phase epitaxy (OMVPE). The substrate 30 is made of, for example, InP, and the sacrificial layer 32 is made of, for example, aluminum indium arsenide (AlInAs).

Figure 4A:
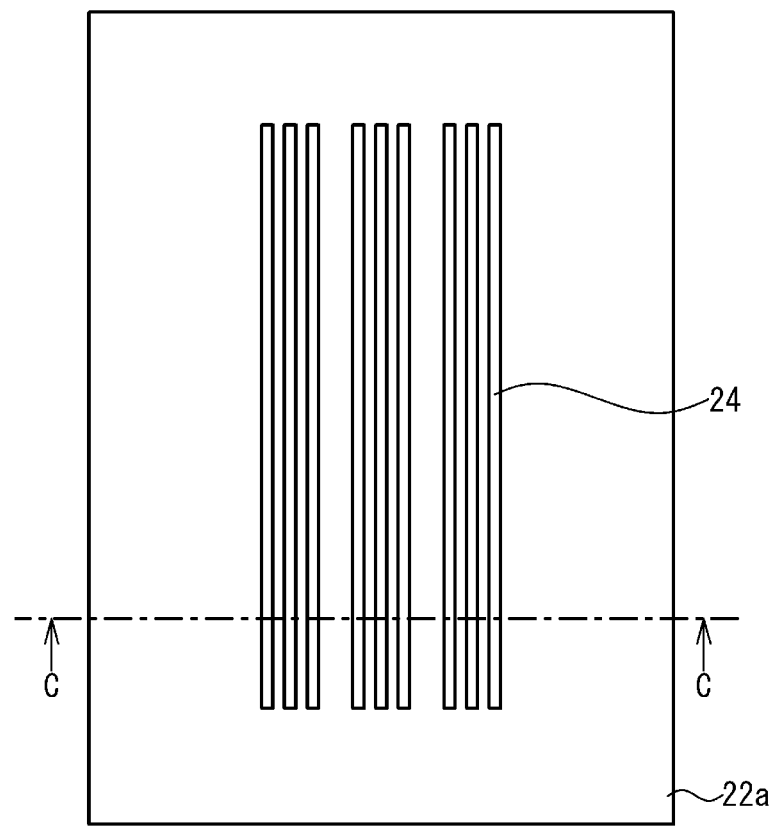
FIG. 4A is a plan view illustrating the method for manufacturing the semiconductor layer.
Figure 4B:
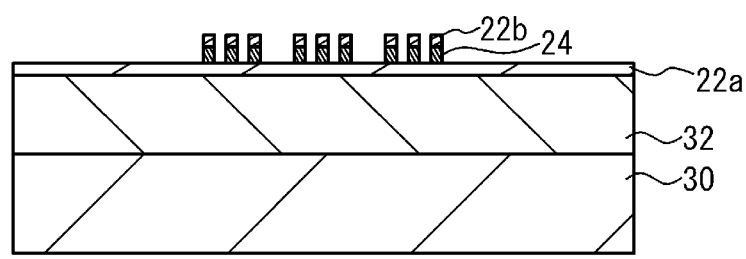
FIG. 4B is a sectional view of FIG. 4A taken along line C-C.

A resist pattern is formed on the InP layer 22b by, for example, electron-beam lithography. As illustrated in FIGS. 4A and 4B, the InP layer 22b and the GaInAsP layer 24 are dry etched by using methane ($CH_4$) and hydrogen ($H_2$)-based gas, so that the InP layer 22b and the GaInAsP layer 24 are patterned.

Figure 5A:
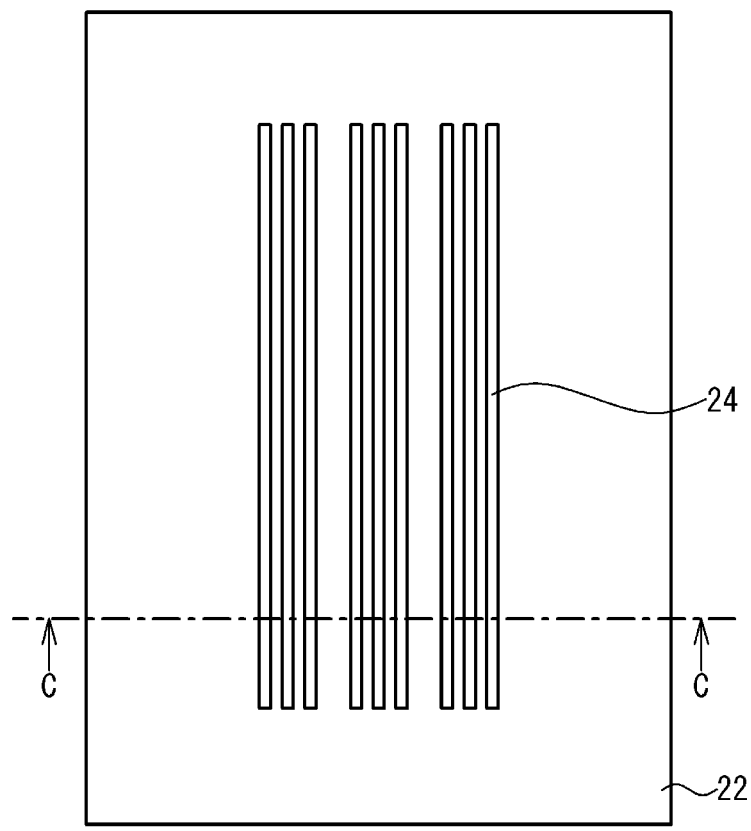
FIG. 5A is a plan view illustrating the method for manufacturing the semiconductor layer.
Figure 5B:
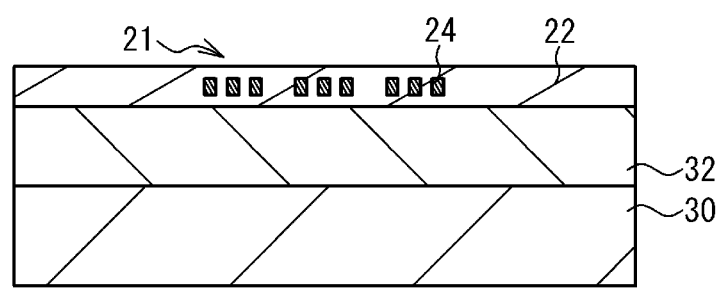
FIG. 5B is a sectional view of FIG. 5A taken along line C-C.

As illustrated in FIGS. 5A and 5B, an InP layer is epitaxially grown by, for example, OMVPE. The InP layer is integrated with the InP layers 22a and 22b so that the InP layer 22 in which the GaInAsP layer 24 is embedded is formed.

Figure 6A:
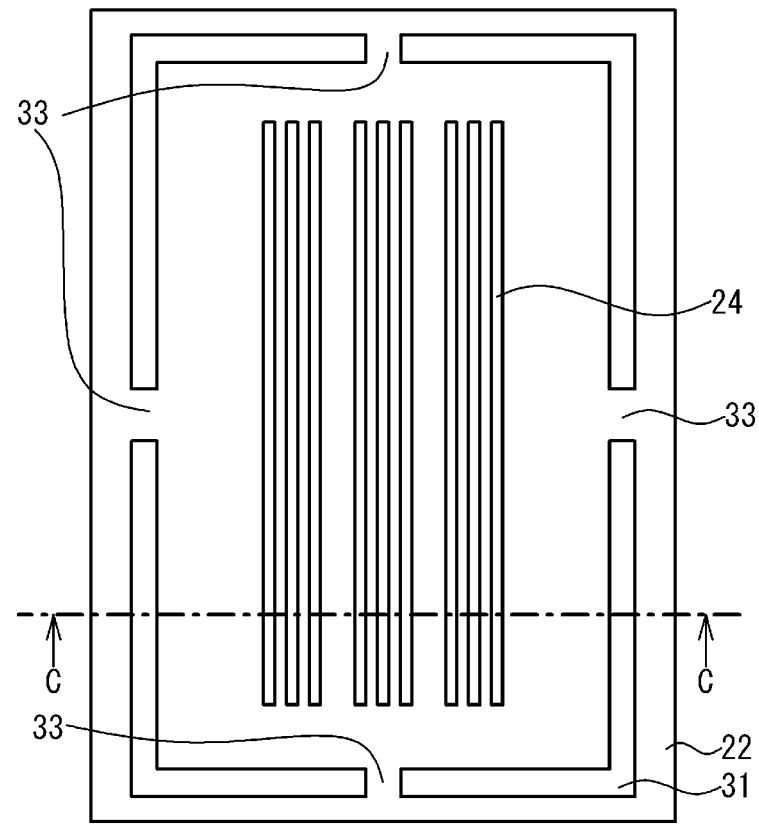
FIG. 6A is a plan view illustrating the method for manufacturing the semiconductor layer.
Figure 6B:
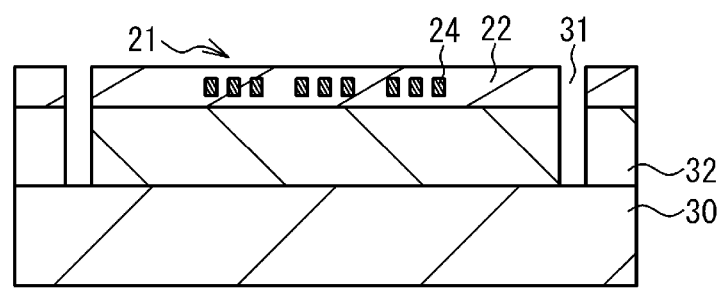
FIG. 6B is a sectional view of FIG. 6A taken along line C-C.

As illustrated in FIGS. 6A and 6B, the InP layer 22 and the sacrificial layer 32 are dry etched in regions outside the GaInAsP layer 24 to form openings 31. The openings 31 surround the GaInAsP layer 24, and side surfaces of the sacrificial layer 32 and a front surface of the substrate 30 are exposed at the openings 31. As illustrated in FIG. 6A, portions inside and outside the openings 31 are connected to each other by bridges 33.

Figure 7A:
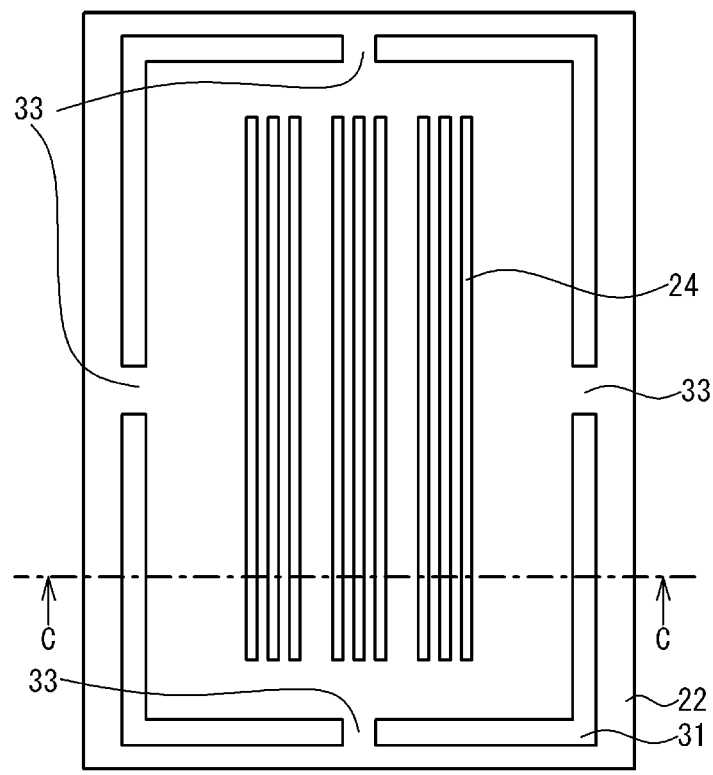
FIG. 7A is a plan view illustrating the method for manufacturing the semiconductor layer.
Figure 7B:
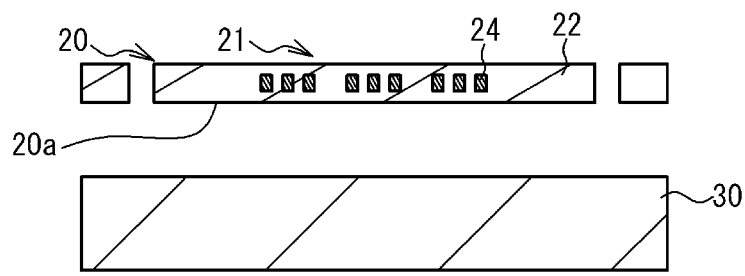
FIG. 7B is a sectional view of FIG. 7A taken along line C-C.
Figure 7C:
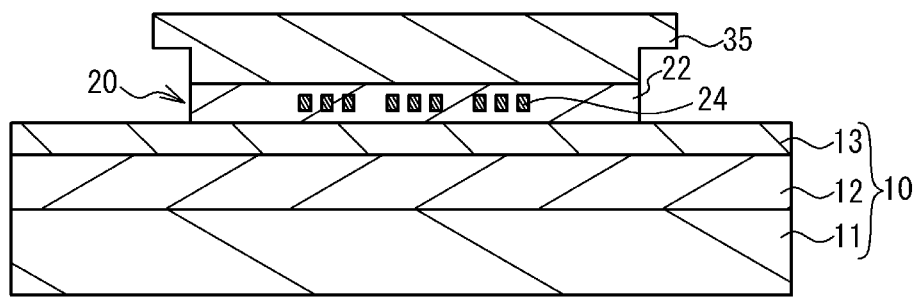
FIG. 7C is a sectional view illustrating a step of joining the semiconductor layer to a substrate.

As illustrated in FIGS. 7A and 7B, the semiconductor layer 20 is formed by removing the sacrificial layer 32 by wet etching. A lower surface 20a of the semiconductor layer 20 is exposed after the wet etching process. The semiconductor layer 20 is supported by the bridges 33.

As illustrated in FIG. 7C, a stamp 35 made of a resin (polydimethylsiloxane (PDMS)) is brought into contact with the upper surface of the semiconductor layer 20. When the semiconductor layer 20 is raised by the stamp 35, the bridges 33 are cut and the semiconductor layer 20 is separated from the substrate 30. The stamp 35 carries the semiconductor layer 20 onto the substrate 10 so that the surface 20a comes into contact with the substrate 10. The semiconductor layer 20 is pressed against the substrate 10 so that the semiconductor layer 20 is joined to the substrate 10. After the joining process, a resist pattern is formed on the semiconductor layer 20. Portions that are not protected by the resist pattern are dry etched by using methane/hydrogen-based gas ($CH_4$ and $H_2$) so that the tapered portions 23 illustrated in FIG. 1A are formed. After the joining process, the SOI substrate is diced so that a plurality of semiconductor optical devices 100 are formed. As described above, an insulating film that covers the substrate 10 and the semiconductor layer 20 may be provided. When an insulating film is formed, an insulating film made of $SiO_2$ may be formed on the upper surface of the substrate 10 and the upper surface of the semiconductor layer 20 by, for example, chemical vapor deposition (CVD) or sputtering before the dicing process.

Figure 8:
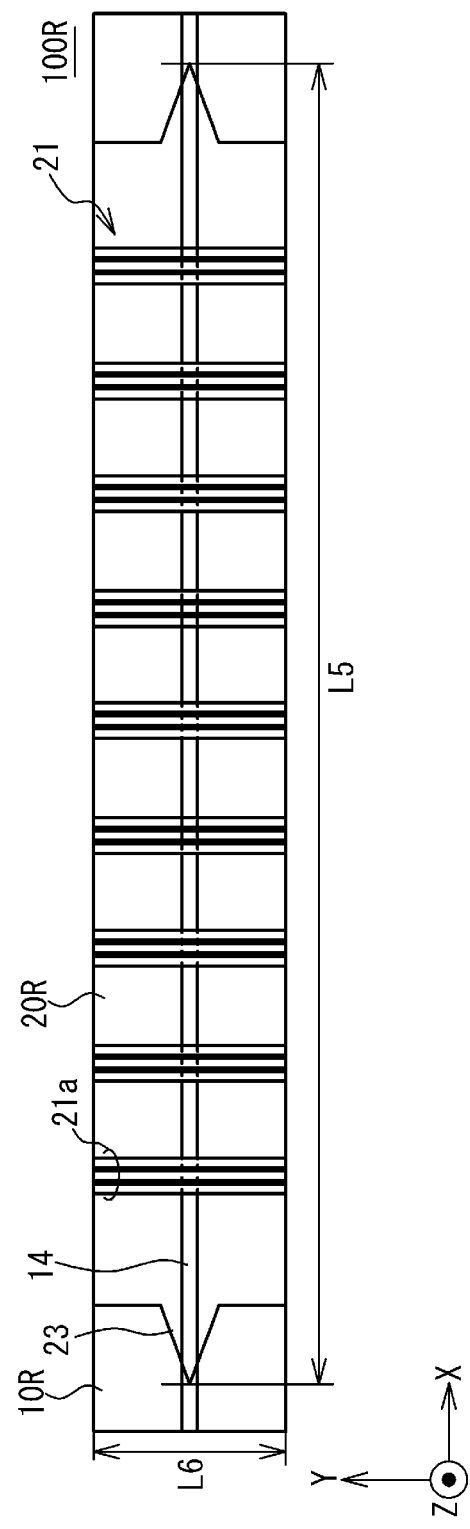
FIG. 8 is a plan view of a semiconductor device according to a comparative example.

FIG. 8 is a plan view illustrating a semiconductor device 100R according to a comparative example. The semiconductor device 100R includes a substrate 10R and a semiconductor layer 20R. The substrate 10R has a waveguide 14 that extends straight in the X-axis direction and that has no bent portions. The semiconductor layer 20R is joined to the substrate 10R, and includes a diffraction grating 21. The diffraction grating 21 includes a plurality of partial diffraction gratings 21a. The partial diffraction gratings 21a are positioned above the waveguide 14 and arranged in the X-axis direction.

Since an SG-DBR is formed of the plurality of partial diffraction gratings 21a, a high reflectance can be obtained. However, since the partial diffraction gratings 21a are arranged above the waveguide 14, the semiconductor layer 20R is long in the X-axis direction. A length L5 of the semiconductor layer 20R in the X-axis direction is, for example, 2 mm, and is greater than or equal to 0.5 mm. A length L6 of the semiconductor layer 20R in the Y-axis direction is, for example, 0.5 mm, and is less than L5. The semiconductor layer 20R has a large aspect ratio L5/L6, and the mechanical strength thereof is low. The semiconductor layer 20R may be distorted in, for example, a joining process, and there is a risk that, for example, the wavelength will vary.

According to the first embodiment, the waveguide 14 includes the straight portions 14a1 to 14a3 and the bent portions 14b1 and 14b2. Therefore, compared to the case where the waveguide 14 is straight as in the comparative example, the waveguide 14 has a shorter length in the X-axis direction. The length L3 of the semiconductor layer 20, which is joined to the waveguide 14, in the X-axis direction is also reduced, and the aspect ratio L3/L2 of the semiconductor layer 20 is reduced accordingly. In other words, compared to the semiconductor layer 20R having an elongated shape illustrated in FIG. 8, the semiconductor layer 20 illustrated in FIG. 1A has a shape closer to square in plan view and has a higher mechanical strength. The semiconductor layer 20 is not easily distorted in, for example, a joining process, and the characteristics thereof are not easily degraded.

When a diffraction grating is formed on the Si layer 13 of the substrate 10, the characteristics of the diffraction grating greatly vary due to variations in the etching depth of the Si layer 13 because the difference in refractive index between Si and air is large. The diffraction grating 21 according to the present embodiment is formed of the InP layer 22 and the GaInAsP layer 24 embedded in the InP layer 22. The difference in refractive index between these layers is less than the difference in refractive index between Si and air. Variations in the characteristics due to, for example, variations in the thickness of the GaInAsP layer 24 are reduced, and the diffraction grating 21 has stable characteristics.

Since the GaInAsP layer 24 is embedded in the InP layer 22, the refractive index distribution of the diffraction grating 21 is symmetric about a plane orthogonal to the vertical direction (Z-axis direction). Therefore, scattering loss can be reduced. For example, a gas flow rate and a growth time in OMVPE may be adjusted to control the thickness of the InP layer 22 and the thickness T2 of the GaInAsP layer 24, and thus the effective refractive index can be adjusted. The diffraction grating 21 may be formed of compound semiconductors other than InP and GaInAsP. When, in particular, III-V compound semiconductors are used, stable characteristics can be obtained. A plurality of compound semiconductor layers having different refractive indices are caused to function as the diffraction grating 21.

The semiconductor layer 20 is provided above the three straight portions 14a1 to 14a3 of the waveguide 14. Therefore, the diffraction grating 21 is formed above each of the straight portions. Excellent characteristics similar to those obtained when the diffraction grating 21 is disposed above a long waveguide 14 as in the comparative example can be obtained. For example, as illustrated in FIG. 1A, the three partial diffraction gratings 21a of the diffraction grating 21 extend across and above the three straight portions 14a1 to 14a3 of the waveguide 14. Characteristics similar to those of the structure in which nine partial diffraction gratings are disposed above the waveguide 14 can be obtained.

The partial diffraction gratings 21a are periodically arranged along the straight portions 14a1 to 14a3 of the waveguide 14 and form an SG-DBR region. The diffraction grating 21 has the reflection characteristics shown in FIG. 2, and reflect light that propagates through the waveguide 14. The number of partial diffraction gratings 21a may be two or three or more. The partial diffraction gratings 21a may be arranged at either equal or varying intervals. It is not necessary that the diffraction grating 21 function as an SG-DBR or include the partial diffraction gratings 21a.

As illustrated in FIG. 1A, the bent portions 14b1 and 14b2 of the waveguide 14 are bent 180°, and the straight portions 14a1 to 14a3 extend in the same direction (X-axis direction). The waveguide 14 has a short length in the X-axis direction and, similarly to the waveguide 14, the semiconductor layer 20 also has a short length in the X-axis direction. The semiconductor layer 20 has a small aspect ratio, and the mechanical strength thereof is increased. Since the diffraction grating 21 extends across the three straight portions 14a1 to 14a3 in the Y-axis direction, characteristics that are the same as those of a structure in which each of the straight portions 14a1 to 14a3 is provided with the diffraction grating 21 can be obtained. The number of straight portions and the number of bent portions may be changed as long as the waveguide 14 includes two or more straight portions and one or more bent portions that connect the straight portions. The bent portion may be circular-arc-shaped or elliptical-arc-shaped. Although the bent portions may have different shapes, the shapes thereof are preferably the same. In such a case, the bent portions have identical optical paths.

The grooves 15 in the substrate 10 are hollow and filled with air. Since the difference in refractive index between the waveguide 14 made of Si and air is large, the waveguide 14 has a strong light confinement effect in a lateral direction. Light loss in the bent portions 14b1 and 14b2 of the waveguide 14 is reduced. The radius of curvature of the bent portions 14b1 and 14b2 and the thickness of the semiconductor layer 20 are determined in consideration of, for example, the effective refractive index so that light loss is reduced.

As illustrated in FIG. 1A, the semiconductor layer 20 includes tapered portions 23 at end portions thereof and above the waveguide 14. The tapered portions 23 reduce reflection of light at the end portions so that the coupling efficiency between the semiconductor layer 20 and the waveguide 14 is increased and that light loss is reduced.

As illustrated in FIG. 7C, the semiconductor layer 20 formed on the compound semiconductor wafer is moved onto and joined to the substrate 10 by transfer-printing. The joining strength is increased because the surface 20a, which is flat after the etching process, is brought into contact with the upper surface of the substrate 10. The bonding method may be a method other than transfer-printing.

Second Embodiment

Figure 9:
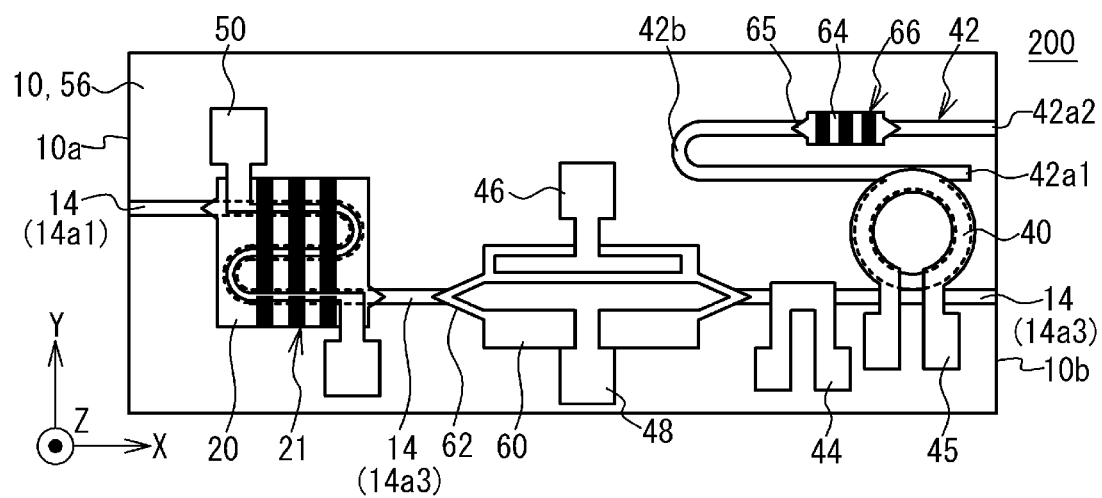
FIG. 9 is a plan view illustrating a semiconductor optical device according to a second embodiment.
Figure 10A:
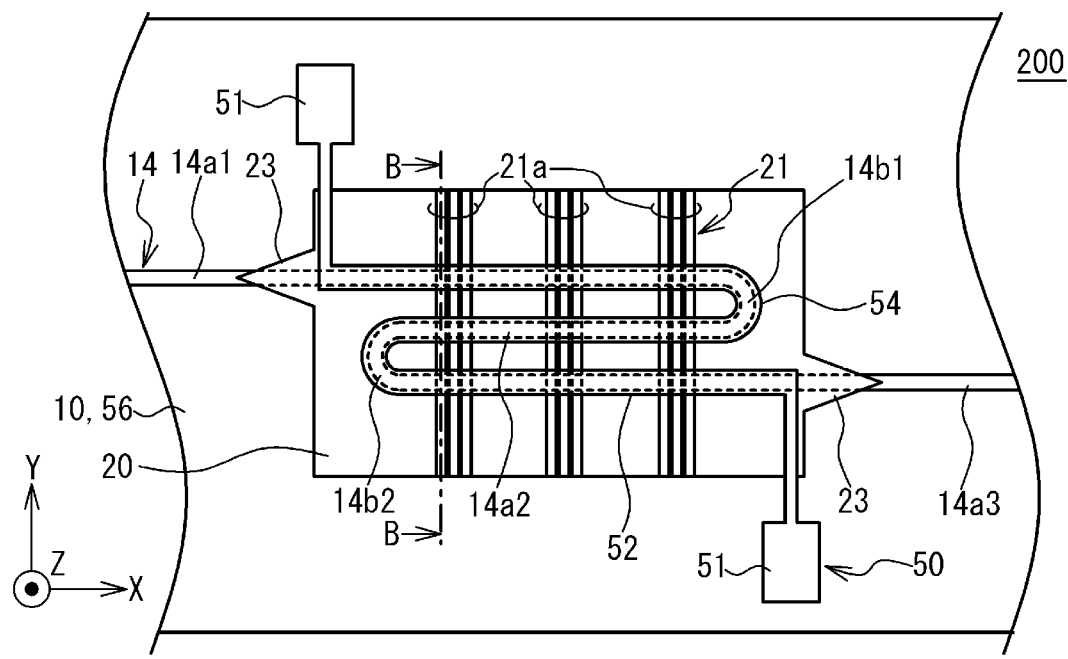
FIG. 10A is an enlarged plan view of a region including a semiconductor layer.
Figure 10B:
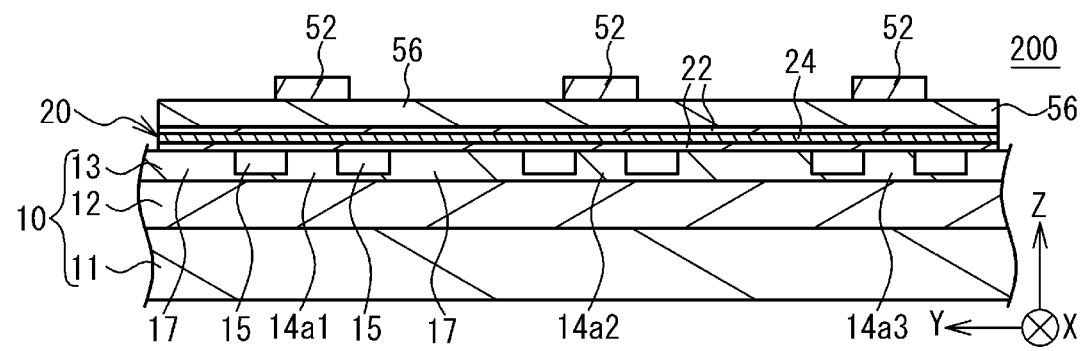
FIG. 10B is a sectional view of FIG. 10A taken along line B-B.

FIG. 9 is a plan view illustrating a semiconductor optical device 200 according to a second embodiment. FIG. 10A is an enlarged plan view of a region including a semiconductor layer 20. FIG. 10B is a sectional view of FIG. 10A taken along line B-B. As illustrated in FIG. 9, the semiconductor optical device 200 is a hybrid wavelength tunable laser device including a substrate 10, semiconductor layers 20, 60, and 64, and an electrode 50. Description of structures similar to those of the first embodiment will be omitted.

The substrate 10 is an SOI substrate, and includes waveguides 14 and 42 and a ring resonator 40, as illustrated in FIG. 9. The semiconductor layer 20, the semiconductor layer 60 (gain region), and the ring resonator 40 are arranged from an end portion 10a toward an end portion 10b of the substrate 10. An insulating film 56, which is formed of an insulator, such as $SiO_2$, covers the substrate 10 and the semiconductor layer 20, as illustrated in FIG. 10B, and also covers the semiconductor layers 60 and 64 illustrated in FIG. 9.

As illustrated in FIG. 9, a straight portion 14a3 of the waveguide 14, the ring resonator 40, and the waveguide 42 are arranged in the Y-axis direction along the end portion 10b of the substrate 10. The waveguide 42 includes two straight portions 42a1 and 42a2 and a single bent portion 42b. The straight portions 42a1 and 42a2 extend in the X-axis direction, and are arranged in the Y-axis direction together with the straight portion 14a3 of the waveguide 14. The bent portion 42b is, for example, bent 180°. The straight portion 42a1 is connected to one end of the bent portion 42b, and the straight portion 42a2 is connected to the other end of the bent portion 42b. One end of the straight portion 42a2 is positioned on the end portion 10b of the substrate 10. Similarly to the waveguide 14 illustrated in FIG. 10B, each of the waveguide 42 and the ring resonator 40 has grooves 15 on both sides thereof. The upper surfaces of the waveguides 14 and 42 and the ring resonator 40 and the upper surface of a terrace 17 are on the same plane.

The semiconductor layers 20, 60, and 64 are joined to the upper surface of the substrate 10. Similarly to the first embodiment, the semiconductor layer 20 covers the straight portions 14a1 to 14a3 and the bent portions 14b1 and 14b2 of the waveguide 14.

As illustrated in FIG. 10A, the electrode 50 includes pads 51, straight portions 52, and bent portions 54. The electrode 50 is made of a metal, such as a titanium-tungsten alloy (TiW) and is provided on an upper surface of the insulating film 56. The pads 51 are separated from the semiconductor layer 20. The straight portions 52 and the bent portions 54 of the electrode 50 are disposed above the semiconductor layer 20 and arranged along the waveguide 14. The bent portions 54 are positioned above the bent portions 14b1 and 14b2 of the waveguide 14. As illustrated in FIG. 10B, the straight portions 52 of the electrode 50 are positioned above the straight portions 14a1 to 14a3 of the waveguide 14. The pads 51, the straight portions 52, and the bent portions 54 are disposed in, for example, the same metal layer and are electrically connected to each other.

As illustrated in FIG. 9, the semiconductor layer 60 is positioned between the semiconductor layer 20 and the ring resonator 40 and above the straight portion 14a3. The semiconductor layer 60 includes, for example, an n-type cladding layer, a core layer, and a p-type cladding layer stacked in that order from the substrate 10, and has an optical gain. The n-type cladding layer is made of, for example, n-type indium phosphide (n-InP). The p-type cladding layer is made of, for example, p-InP. The core layer includes, for example, a plurality of well layers and a plurality of barrier layers made of non-doped gallium indium arsenide phosphide (i-GaInAsP) and has a multi quantum well (MQW) structure. The semiconductor layer 60 includes tapered portions 62, which are tapered in the X-axis direction, at end portions thereof and above the waveguide 14. The semiconductor layer 60 is evanescently optically coupled to the waveguide 14.

An electrode 46 including, for example, a wiring layer made of, for example, a gold-germanium-nickel alloy (AuGeNi) or Au, is connected to the n-type cladding layer of the semiconductor layer 60. An electrode 48 including, for example, a wiring layer made of, for example, a multilayer body of titanium, platinum, and gold (Ti/Pt/Au) or Au, is connected to the p-type cladding layer.

The semiconductor layer 64 includes a diffraction grating 66, and is provided above the straight portion 42a2 of the waveguide 42. For example, the diffraction grating 66 extends along the waveguide 42 and functions as a DBR region. The semiconductor layer 64 includes tapered portions 65, which are tapered in the X-axis direction, at both ends thereof in the X-axis direction and above the waveguide 42. Similarly to the diffraction grating 21 of the semiconductor layer 20, the diffraction grating 66 of the semiconductor layer 64 is formed of an InP layer and an GaInAsP layer.

The ring resonator 40 is optically coupled to the straight portion 14a3 of the waveguide 14 and the straight portion 42a1 of the waveguide 42. An electrode 45 is provided on the insulating film 56 and the ring resonator 40. An electrode 44 is provided on the insulating film 56 and above the straight portion 14a3 of the waveguide 14, and is positioned between the semiconductor layer 60 and the ring resonator 40. The electrodes 44 and 45 are made of, for example, a metal such as a titanium-tungsten alloy (TiW).

When a voltage is applied between the electrodes 46 and 48, carriers are injected into the core layer of the semiconductor layer 60. Light generated by the semiconductor layer 60 in response to the injection of carriers is transferred from the semiconductor layer 60 to the waveguide 14 and propagates through the waveguide 14. The light enters the semiconductor layer 20 and the ring resonator 40.

Laser light is generated due to the Vernier effect of the diffraction grating 21 of the semiconductor layer 20 and the ring resonator 40. The characteristics of the diffraction grating 21 of the semiconductor layer 20 are, for example, as shown in FIG. 2. Similarly to the diffraction grating 21, the ring resonator 40 also has characteristics including a plurality of peaks. The laser light oscillates at a wavelength at which both the diffraction grating 21 and the ring resonator 40 have peaks. A part of the light is transferred from the waveguide 14 to the waveguide 42. The reflectance of the diffraction grating 66 of the semiconductor layer 64 is less than that of the diffraction grating 21, and therefore the light passes through the semiconductor layer 64 and is emitted to the outside of the semiconductor optical device 200 from an end portion of the straight portion 42a2 of the waveguide 42.

The electrodes 44, 45, and 50 function as heaters. The temperature of the waveguide 14 is changed by applying a current to the electrode 44. The temperature of the ring resonator 40 is changed by applying a current to the electrode 45. By changing the temperatures, the refractive indices of the waveguide 14 and the ring resonator 40 can be changed, and the optical path lengths can be changed accordingly. When a voltage is applied between the pads 51 of the electrode 50 so that a current flows through the straight portions 52 and the bent portions 54, the temperature of the diffraction grating 21 is changed, and the refractive index is changed accordingly. The change in the refractive index causes shifts of the reflectance peaks in FIG. 2, for example, and the oscillation wavelength can be adjusted accordingly.

Manufacturing Method

Four wafers, for example, are used to manufacture the semiconductor optical device 200. The four wafers are a wafer of an SOI substrate for manufacturing the substrate 10, a compound semiconductor wafer for manufacturing the semiconductor layer 20, a wafer for manufacturing the semiconductor layer 60, and a wafer for manufacturing the semiconductor layer 64.

The Si layer 13 of the wafer-shaped substrate 10 is dry etched, for example, to form the waveguides 14 and 42 and the ring resonator 40. The semiconductor layer 20 is manufactured by the same method as that in the first embodiment. Similarly to the semiconductor layer 20, the semiconductor layers 60 and 64 are also formed by growing a semiconductor on a wafer by, for example, OMVPE and dicing the wafer.

The semiconductor layers 20, 60, and 64 are joined to the substrate 10. After the joining process, the tapered portions 23 and the tapered portions 65 are respectively formed on the semiconductor layer 20 and the semiconductor layer 64 by resist patterning and etching. A mesa including a core layer and the tapered portions 62 are formed on the semiconductor layer 60. The insulating film 56 is formed by, for example, sputtering. The electrodes 44, 45, 46, 48, and 50 are formed on the insulating film 56 by, for example, vapor deposition.

According to the second embodiment, similarly to the first embodiment, the semiconductor layer 20 is joined to the waveguide 14 that is bent. Since the aspect ratio L3/L2 of the semiconductor layer 20 is reduced, the mechanical strength of the semiconductor layer 20 is increased. Accordingly, the semiconductor layer 20 is not easily distorted, and the characteristics thereof are not easily degraded.

Since the diffraction grating 21 is formed of the InP layer 22 and the GaInAsP layer 24, the diffraction grating 21 has stable characteristics. The three partial diffraction gratings 21a of the diffraction grating 21 extend across the three straight portions 14a1 to 14a3 of the waveguide 14 and function as an SG-DBR. Characteristics similar to those of a structure in which nine partial diffraction gratings are disposed above the waveguide 14 can be obtained. Light that propagates through the waveguide 14 is reflected between the diffraction grating 21 and the ring resonator 40, and laser oscillation occurs due to the Vernier effect of the diffraction grating 21 and the ring resonator 40. The semiconductor optical device 200 may include two or more ring resonators, and may also include an optical device other than the ring resonator 40.

The wavelength of light can be changed by energizing the electrodes 44, 45, and 50 and changing the temperatures of the waveguide 14, the ring resonator 40, and the diffraction grating 21. As illustrated in FIGS. 10A and 10B, the electrode 50 includes the straight portions 52 and the bent portions 54 provided above the semiconductor layer 20 and having shapes corresponding to the shape of the waveguide 14. Since the three straight portions 52 are arranged in the Y-axis direction, heat is transmitted between adjacent ones of the straight portions 52. Therefore, the amount of electric power consumption can be reduced, and the temperature change and the wavelength control can be efficiently achieved. The electrode 50 may have a shape corresponding to the shape of the waveguide 14.

Third Embodiment

Figure 11:
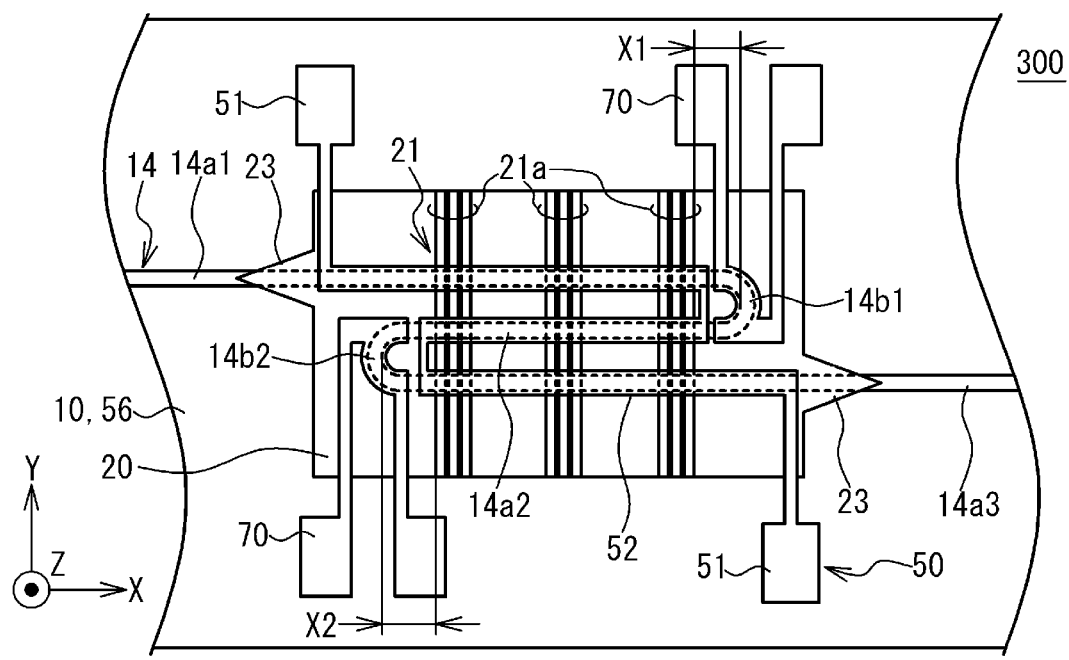
FIG. 11 is a plan view illustrating a semiconductor optical device according to a third embodiment.

FIG. 11 is an enlarged plan view of a semiconductor optical device 300 according to a third embodiment, illustrating a region including a semiconductor layer 20. The semiconductor layer 20 is provided with an electrode 50 and two electrodes 70. Structures other than the electrodes are the same as those in the second embodiment.

The electrode 50 includes no bent portions 54, and is not provided above the bent portions 14b1 and 14b2 of the waveguide 14. One of the two electrodes 70 is provided above the bent portion 14b1, and the other electrode 70 is provided above the bent portion 14b2. The electrodes 70 function as heaters for controlling the temperatures of the bent portions 14b1 and 14b2. The electrode 50 and the electrodes 70 are separated from each other and operate independently.

According to the third embodiment, similarly to the first and second embodiments, the mechanical strength of the semiconductor layer 20 is increased. Since the diffraction grating 21 is formed of the InP layer 22 and the GaInAsP layer 24, the diffraction grating 21 has stable characteristics. Laser oscillation occurs due to the Vernier effect of the diffraction grating 21 and the ring resonator 40.

Referring to FIG. 11, the distance between the rightmost one of the partial diffraction gratings 21a and the bent portion 14b1 is X1, and the distance between the leftmost one of the partial diffraction gratings 21a and the bent portion 14b2 is X2. When the distance X1 and the distance X2 are equal, the optical path lengths are substantially equal and light loss is reduced. However, the distance X1 and the distance X2 may differ due to a displacement that occurs when the semiconductor layer 20 is joined. The electrodes 70 provided above the bent portions 14b1 and 14b2 are used to adjust the refractive indices of the bent portions 14b1 and 14b2 by changing the temperatures of the bent portions 14b1 and 14b2. The difference in optical path length can be reduced by changing the refractive indices so as to compensate for the displacement, and light loss can be reduced accordingly.

Although embodiments of the present disclosure have been described in detail, the present disclosure is not limited to a specific embodiment, and various modifications and alterations are possible within the gist of the present disclosure described in the claims.

What is claimed is:

1. A semiconductor optical device comprising:
   a substrate including an upper surface which includes a waveguide made of silicon; and
   a semiconductor layer being physically connected to the upper surface of the substrate so as to overlap and connect to a portion the waveguide and including a diffraction grating formed of a first semiconductor layer and a second semiconductor layer having different refractive indices,
   wherein the waveguide includes a bent portion and a plurality of straight portions that are connected to each other by the bent portion and that extend straight,
   wherein the first semiconductor layer and the second semiconductor layer are each made of a compound semiconductor,
   wherein the second semiconductor layer is embedded in the first semiconductor layer and includes a plurality of portions arranged in a direction in which the plurality of straight portions extend, and
   wherein the diffraction grating is positioned above the plurality of straight portions.

2. The semiconductor optical device according to claim 1, wherein the plurality of portions of the second semiconductor layer extend across the plurality of straight portions.

3. The semiconductor optical device according to claim 1, wherein the diffraction grating includes a plurality of partial diffraction gratings, and
   wherein the plurality of partial diffraction gratings are arranged along the plurality of straight portions.

4. The semiconductor optical device according to claim 1, wherein the diffraction grating includes a plurality of partial diffraction gratings, and
   wherein the plurality of partial diffraction gratings are arranged periodically along the plurality of straight portions and form an SG-DBR.

5. The semiconductor optical device according to claim 1, wherein the first semiconductor layer contains indium phosphide, and
   wherein the second semiconductor layer contains gallium indium arsenide phosphide.

6. The semiconductor optical device according to claim 1, wherein the plurality of straight portions extend in a same direction.

7. The semiconductor optical device according to claim 1, wherein the plurality of straight portions of the waveguide comprise three or more straight portions, and
wherein the diffraction grating is positioned above the three or more straight portions.

8. The semiconductor optical device according to claim 1, wherein the semiconductor layer includes a tapered portion at an end portion thereof and above at least one of the plurality of straight portions of the waveguide, the tapered portion being tapered along the at least one of the plurality of straight portions.

9. The semiconductor optical device according to claim 1, further comprising:
a heater that is provided on the semiconductor layer and that extends along the waveguide.

10. The semiconductor optical device according to claim 1, further comprising:
a gain region having an optical gain, the gain region being joined to the substrate and formed of a compound semiconductor, and
wherein the semiconductor layer reflects light emitted from the gain region.

11. A method for manufacturing a semiconductor optical device, the method comprising:
a step of physically connecting a semiconductor layer to an upper surface of a substrate so as to overlap and connect to a portion of a waveguide made of silicon, the upper surface includes the waveguide, the semiconductor layer including a diffraction grating formed of a first semiconductor layer and a second semiconductor layer having different refractive indices,
wherein the waveguide includes a bent portion and a plurality of straight portions that are connected to each other by the bent portion and that extend straight,
wherein the first semiconductor layer and the second semiconductor layer are each made of a compound semiconductor,
wherein the second semiconductor layer is embedded in the first semiconductor layer and includes a plurality of portions arranged in a direction in which the plurality of straight portions extend, and
wherein, in the step of joining the semiconductor layer to the substrate, the semiconductor layer is joined so that the diffraction grating extends in the direction in which the plurality of straight portions extend and is positioned above the plurality of straight portions.

* * * * *